United States Patent [19]

Turi et al.

[11] Patent Number: 4,473,941

[45] Date of Patent: Oct. 2, 1984

[54] METHOD OF FABRICATING ZENER DIODES

[75] Inventors: Raymond A. Turi, Miamisburg; James A. Topich, Centerville; John E. Dickman, Miamisburg, all of Ohio

[73] Assignee: NCR Corporation, Dayton, Ohio

[21] Appl. No.: 452,343

[22] Filed: Dec. 22, 1982

[51] Int. Cl.$^3$ .................. H01L 21/223; H01L 21/265
[52] U.S. Cl. ...................... 29/578; 29/576 B; 148/187
[58] Field of Search ............ 29/578, 576 B, 571; 148/1.5, 187

[56] References Cited

U.S. PATENT DOCUMENTS

| | | | |
|---|---|---|---|
| 3,677,838 | 7/1972 | De Brebisson | 148/175 |
| 4,099,998 | 7/1978 | Ferro et al. | 29/574 X |
| 4,104,085 | 8/1978 | Zandweld | 148/1.5 |
| 4,119,440 | 10/1978 | Hile | 148/1.5 |
| 4,155,777 | 5/1979 | Dunkley et al. | 148/1.5 |
| 4,177,095 | 12/1979 | Nelson | 148/187 X |
| 4,349,394 | 9/1982 | Wei | 148/175 |
| 4,357,178 | 11/1982 | Bergeron et al. | 29/578 X |
| 4,393,575 | 7/1983 | Dunkley et al. | 148/175 X |

Primary Examiner—G. Ozaki
Attorney, Agent, or Firm—J. T. Cavender; Casimer K. Salys

[57] ABSTRACT

A process for forming zener diodes from an IC structure having coextensive layers of gate silicon dioxide and polycrystalline silicon on a substrate and self-aligned with a diffused region in the substrate. A differential oxidation of the polycrystalline silicon and substrate silicon is followed in turn by a silicon dioxide etch to expose only the polycrystalline silicon layer. Thereafter, the exposed polycrystalline silicon is etched with an etchant that does not materially etch silicon dioxide. The exposed substrate is then subjected to an ion implantation, performed with an energy sufficient to locate the peak impurity concentration below the substrate surface, and a dose sufficient to moderately dope the area originally under the polycrystalline silicon electrode while reducing the effective concentration of the opposite impurity type dopant in the diffused region of the substrate. Residual silicon dioxide is now removed with an etchant that does not materially etch silicon; exposing the active area of the substrate. Annealing follows to heal implant and etching damage. The junction of the zener diode formed thereby is located below the substrate surface and displaced laterally from any area of etchant damage to provide stable and reproducible zener break-down characteristics.

9 Claims, 21 Drawing Figures

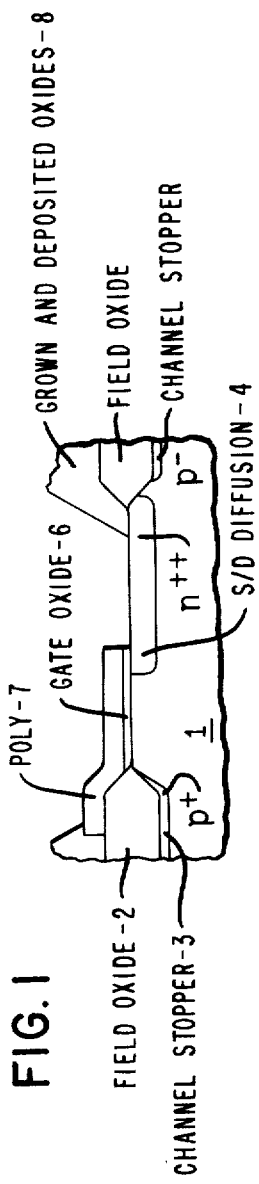
FIG. 1
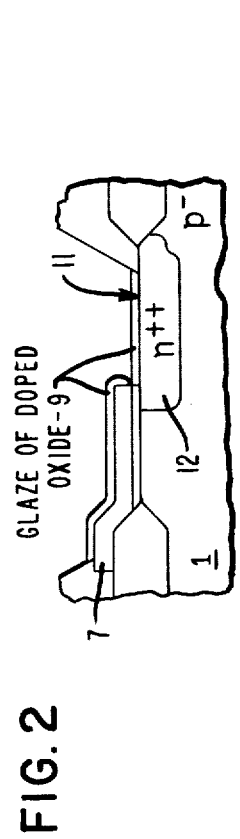
FIG. 2
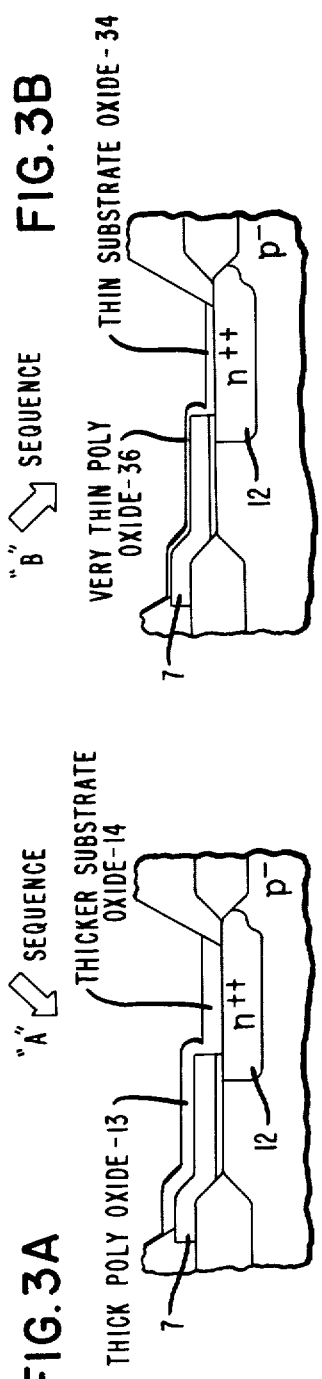
FIG. 3A
FIG. 3B

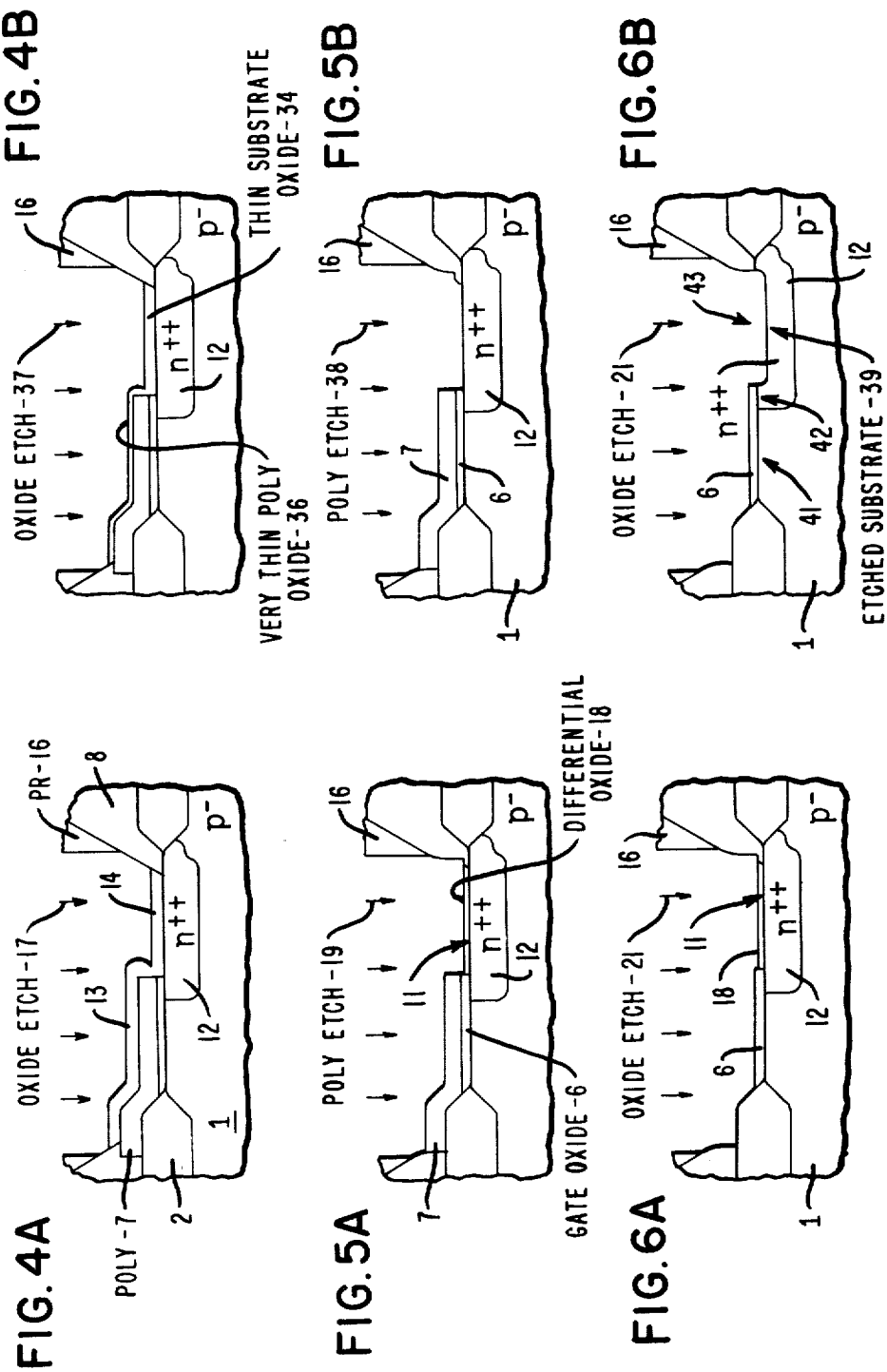

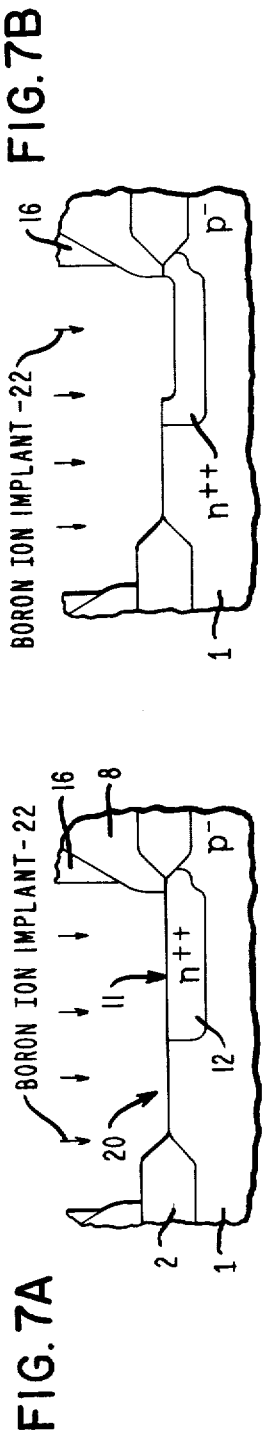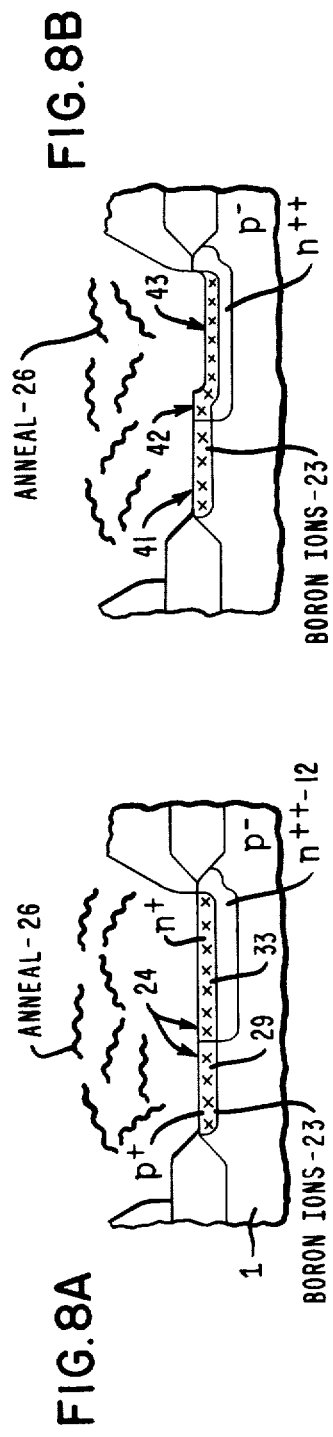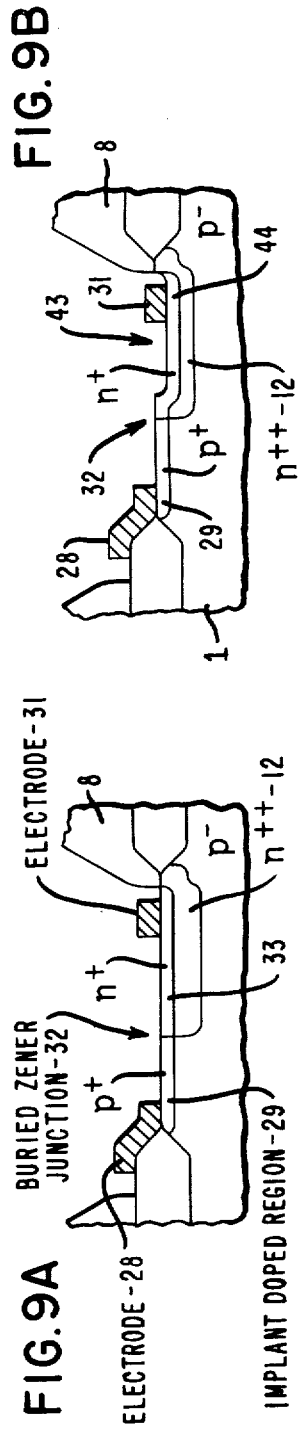

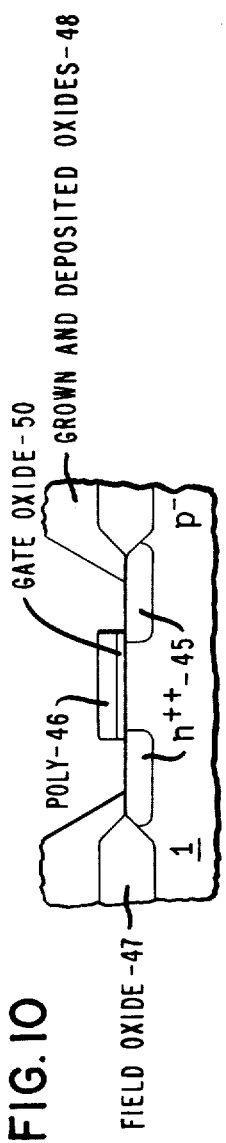
FIG.10
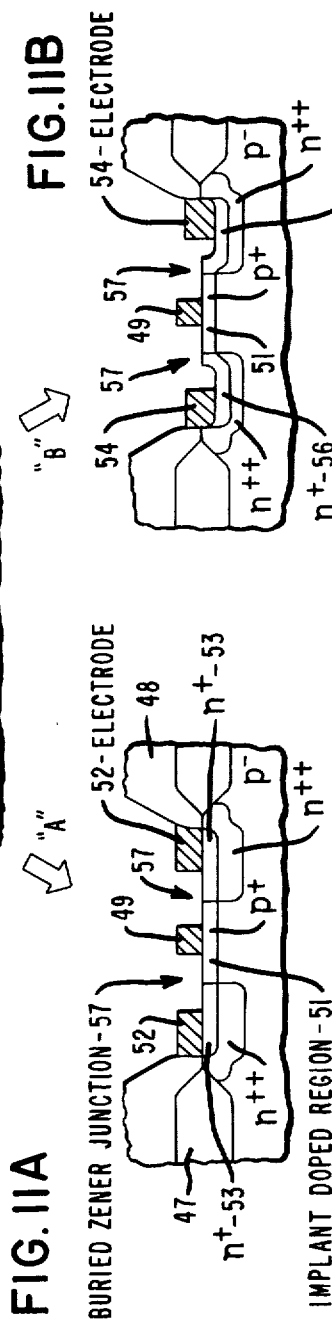
FIG.11A
FIG.11B
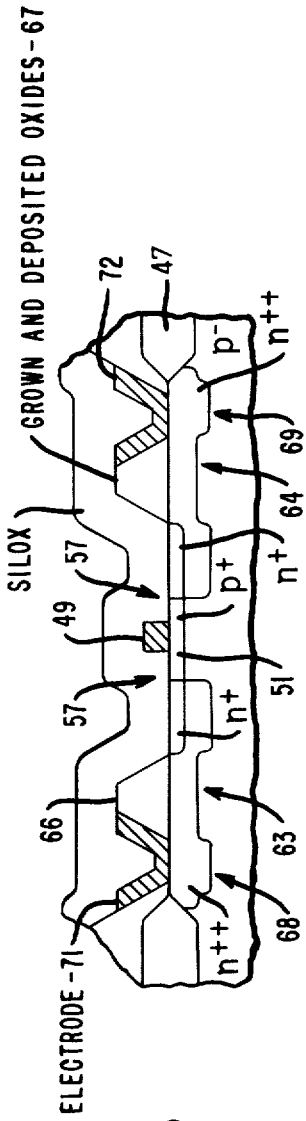
FIG.13

METHOD OF FABRICATING ZENER DIODES

BRIEF SUMMARY

The present invention relates to a process for fabricating zener diodes having steps which form an integral part of an otherwise unified process for fabricating field effect transistors (FETs). The process imposes no critical mask alignment operations and no significant departures from standard FET processes which utilize polycrystalline silicon (poly) for the first conductive layer. Adjacent or concentric configurations of zener diodes are formed in electrically isolated active regions which have been defined and appropriately masked during FET formation to retain FET-like structures at each zener diode location. Zener diodes fabricated in the manner taught herein are consistent in breakdown voltage and exhibits good temperature coefficient characteristics. Furthermore, the process establishes a reproducible relationship between the zener breakdown voltage and the ion implant dose used in fabrication.

In one form, the process featured herein follows conventional FET fabrication through the normal sequence of isolating an active region on a silicon wafer or substrate, forming a gate dielectric layer of silicon dioxide (oxide), depositing polycrystalline silicon (poly) for the first conductive layer, sequentially etching the poly and gate oxide layers to expose peripheral source/drain (S/D) regions, forming electrode contacts, and then doping the S/D regions to form self-aligned diffusions in the substrate. Generally, conventional processing continues with an oxidation of any exposed silicon and a deposition and photolithographic processing of the succeeding photoresist (PR) mask.

According to one practice of the present process, the oxidation of exposed silicon is specifically prescribed in one of two forms to suit the oxide-poly-oxide etch sequence which follows. The PR mask used during etching and ion implantation is deposited after oxidation and is patterned to expose the zener diode active regions for processing. The exposed active regions are subjected to a sequence of oxide, poly and oxide etches to remove, respectively, the latter formed oxide layer, the poly layer, and the gate oxide layer. An ion implant of appropriate dose and impurity follows, to form a zener diode junction at the intersection of the implant doped region and the formerly doped S/D diffusion.

The process described above is suitable for the fabrication of both adjacent and concentrical zener diode structures, where the latter configuration is characterized by the presence of a significantly greater junction region. The increase in junction region for the concentric zener diode is attributable to a diffused S/D region which substantially encircles the area of the poly layer.

Conventional fabrication is reinitiated after the ion implant operation, with appropriate PR masking to fabricate electrodes or other devices in the manner commonly followed heretofore.

A greater appreciation for the fundamental process and variance thereto will be gained by considering the ensuing detailed description.

BRIEF DESCRIPTION OF THE DRAWINGS

FIG. 1 is a cross-sectional schematic of an active region in the course of conventional processing.

FIG. 2 shows the effects of a contact enhancement diffusion step on the structure in FIG. 1.

FIGS. 3A, 4A, 5A, 6A, 7A, 8A and 9A schematically depict the stages in a first sequence, which is suitable to fabricate an adjacent form of zener diode.

FIG. 3B, 4B, 5B, 6B, 7B, 8B and 9B schematically depict the stages in a second process sequence, which is suitable to fabricate a second form of an adjacent zener diode.

FIG. 10 schematically depicts the concentric zener diode configuration at the onset of fabrication.

FIGS. 11A and 11B schematically depict concentric zener diodes fabricated according to the first and second process sequences.

FIG. 13 schematically illustrates a further variation on the concentric zener diode configuration.

DETAILED DESCRIPTION

Figure 12:
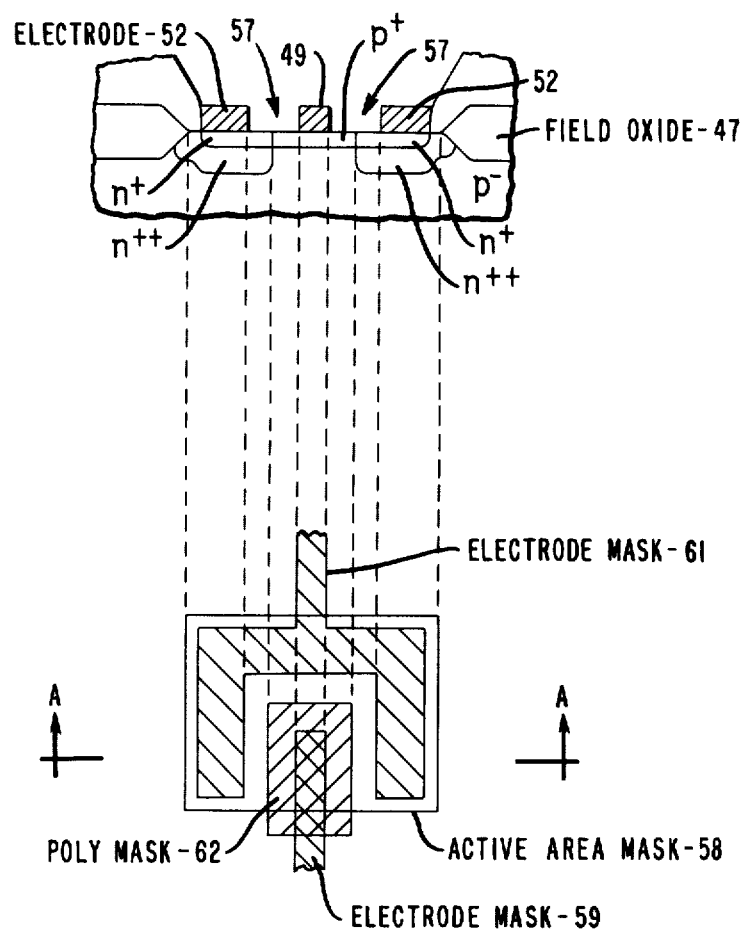
FIG. 12 schematically depicts a concentric zener diode and its relationship to the FET fabrication masks.

The broad concept of forming zener diodes during the course of fabricating integrated circuits on semiconductor wafers is generally known. The related arts also disclose the utilization of ion implantation techniques to locate the peak impurity concentration measurably below the substrate surface as a means of stabilizing the voltage at which zener avalanching commences. For an understanding of these and other aspects of the related art, reference should be made to U.S. Pat. No. 4,155,777.

The presently disclosed invention defines a unique process for creating zener diodes having the attributes noted in the prior art without departing materially from the steps which characterize a conventional sequence for fabricating integrated circuit FET devices. In particular, the present process explicitly avoids additional masks requiring critical alignments. The steps of the process are also compatible with at least one method for forming contacts to an electrically isolated epitaxial (epi) layer on a wafer substrate, as exemplified by the process described in the copending U.S. patent application having Ser. No. 409,193, which application is assigned to the assignee of the present invention.

A number of embodiments by which the novel process may be practiced will be described with reference to the accompanying drawings. For example, the one process for fabricating an adjacent zener diode is depicted in the "A" sequence of drawings, encompassing FIGS. 1, 2, 3A, 4A, 5A, 6A, 7A, 8A and 9A. A second variation of the adjacent zener diode process is shown in the "B" sequence of steps, covered by FIGS. 1, 2, 3B, 4B, 5B, 6B, 7B, 8B and 9B. The structures at corresponding stages in the "A" and "B" sequences for the adjacent diode are shown side-by-side to provide ready comparison. The variation of the process intended for forming concentric diodes is shown at the initial stage in FIG. 10, and concluding stages in Figs. 11A and 11B for the respective sequences. The increase in zener area with the concentric diode configuration is visibly apparent from the mask patterns shown in FIG. 12. The description of the process and related figures will begin with a development of the first process for fabricating an adjacent diode configuration, introduce the alternate process for fabricating the adjacent diode configuration, and then apply the two sequence variations to the fabrication of a concentric zener diode.

As noted hereinbefore, one unique feature of the process is the ease with which the new steps can be introduced into a conventional FET fabrication process without departing materially from the overall process flow. For purposes of illustration, a representative conventional FET fabrication sequence would involve the processing of a monocrystalline silicon semiconductor wafer to form an electrically isolated epitaxial (epi) layer, partitioning of the epi layer with dopants and field oxide formations, implanting the channel regions of the FETs to adjust the threshold voltages, growing gate oxides, depositing and patterning a poly layer, diffusing or otherwise doping S/D regions in the substrate, growing or depositing oxide, and forming electrode contacts.

FIG. 1 depicts a structure representing the outcome of a FET formation sequence according to the common practice of the prior art. As shown, the FET-like structure is formed on substrate 1, which could also be an epitaxial layer, having a lightly doped p-type impurity to a $p^-$ concentration in the range of $8\text{-}10\times 10^{14}$ ions/cm$^3$, field oxides 2, p+ doped channel stopper implants 3 under field oxides 2, heavily doped S/D diffusion 4 with an n++ phosphorus concentration in the range of $10^{20}\text{-}10^{21}$ ions/cm$^3$, gate oxide layer 6 of approximately 700 Angstroms in thickness, poly layer 7 of approximately 3000 Angstroms in thickness, and various grown and deposited oxides 8.

Irrespective of the sequence followed, the structure in FIG. 1 is subjected to a contact enhancement diffusion with POCl$_3$, as is common in the practice, and the 600 Angstroms of doped oxide glaze 9 shown in FIG. 2 is removed with conventional oxide etch 10 to expose poly layer 7 and surface 11 of diffused region 12 in substrate 1.

Consider the "A" sequence first. In progressing from the structure in FIG. 2 to that in Fig. 3A, the wafer is first subjected to an oxidation in wet O$_2$ at 750° C. for approximately 10 minutes. The use of wet O$_2$ promotes significant differential growth of oxide, when comparing that formed on poly layer 7 to that formed on diffusion 12. For the conditions defined, the process forms a nominal 300±100 Angstrom layer of oxide 13 over poly 7 while forming an oxide layer 14 of approximately twice that amount, to a nominal thickness of 600 Angstroms, over diffused region 12.

According to the embodied process sequence, the structure shown in FIG. 3A is then covered with PR 16 and subjected to photolithographic pattern formation to expose only the active regions between field oxides 2, as shown in FIG. 4A. Thereafter, the exposed sections of the wafer are subjected to an oxide etch, 17, using a wet etchant composed of 7:1 buffered HF, (NH$_4$)F to HF, for approximately 5 seconds to remove approximately 400 Angstroms of exposed oxide. It is also possible to use a dry etch process. The outcome of the step is shown in FIG. 5A, where oxide 13 over poly 7 has been completely removed while approximately 200±100 Angstroms in the form of a differential oxide layer 18 remains over diffused region 12.

The thickness of the oxide retained as differential oxide 18 in FIG. 5A is dictated to a great extent by the etching characteristics of the material used to perform poly etch 19. If poly etch 19 is implemented with a wet etchant such as 30:15:1 of acetic, nitric and hydrofluoric acids, the preferential etch ratio of approximately 250:1, poly-to-oxide, permits a significantly thinner layer in differential oxide 18 to sustain full masking of surface 11. On the other hand, a plasma etch with CF$_4$ plus O$_2$ provides only a 25:1 ratio and requires a proportionately thicker oxide layer 18. With the latter etchant, the differential oxide must be in excess of 900 Angstroms to ensure masking of substrate surface 11 during the etching of the approximately 3,000 Angstroms of poly 7.

Upon the conclusion of poly etch 19, with PR mask 16 in place, the wafer is subjected to oxide etch 21, as generally illustrated in FIG. 6A, to remove the approximately 700 Angstroms of gate oxide 6 and the remaining differential oxide 18. The silicon composition of substrate 1 at surface 11 of diffused region 12 serves as an etchant stop during this operation. A suitable implementation of oxide etch 21 is a wet etch with 7:1 buffered HF for 40 seconds.

The succeeding operation in the zener diode formation process is schematically depicted in FIG. 7A. Without removing PR mask 16 the wafer is subjected to a boron ion implant 22 with a dose of $1\times 10^{15}$ ions/cm$^2$ and an implant energy of 50 KeV. The implant covers not only n++ doped diffusion region 12 but extends across $p^-$ doped substrate 1 at location 20. Furthermore, with the selected implant energy, boron ions are implanted below the surface of substrate 1 at 20 and surface 11 of diffusion 12. Note that the same PR mask, 16, was utilized for the operation depicted in FIGS. 4A, 5A, 6A and 7A.

It should be recognized that the boron ion implant, 22, can be performed through gate oxide layer 6 and differential oxide layer 18, as exemplified by the interchange of FIGS. 6A and 7A. The benefit acquired with such a change in the sequence of the etching and implanting steps appears in terms of reproducibility as to implant depth and distribution. Experience has shown that ions implanted into bare silicon surfaces may follow the silicon lattice, and thereby penetrate to excessive depths with inconsistent distributions. Unfortunately, oxides 6 and 18 are also not consistent in thickness.

After boron ion implant 22, PR mask 16 is removed and the wafer is subjected to an annealing operation, reference 26 in FIG. 8A, to heal defects in surface 24 caused during boron ion implant 22. In the embodied epitaxial process, an H$_2$ annealing environment is utilized. It is also possible to use other gases or a metal alloying cycle to perform the operation. The annealing further diffuses boron ions 23, represented by "X" symbols, into substrate 1 and region 12. The peak boron concentration, however, remains at the implanted depth of approximately 1800 Angstroms.

FIG. 9A shows that the boron ion implant has altered the effective impurity concentration of both regions 29 and 33. Whereas region 29 was formerly lightly doped $p^-$, the implant has changed the impurity to a moderately doped p+ having a concentration in the range between $10^{18}$ and $10^{19}$ ions/cm$^3$. The initial heavy phosphorus impurity level of region 12 ensures that subregion 33 maintains its n-type conductivity. However, the compensating effect of the boron implant now makes subregion 33 of region 12 a less heavily doped n+. The buried zener diode junction at 32 is situated at the interface between moderately doped p+ region 29 and less heavily doped n+ region 33.

With the zener diode in place, commonly known electrode formation and wafer passivation processes are implemented to complete the IC.

FIG. 9A is merely illustrative of the electrode arrangements suitable to access the zener diode.

Exemplary characteristics of zener diodes fabricated according to the above-described process are presented in Table A.

TABLE A

Zener diode breakdown voltages for a wafer subjected to a $1 \times 10^{15}$ ions/cm$^2$ boron implant dose at 75 KeV.

| Diode Current (μamps) | Mean Breakdown (Volts) | Std. Deviation (Volts) |
|---|---|---|
| 100 | 5.90 | 0.07 |
| 50 | 5.83 | 0.12 |
| 10 | 5.55 | 0.50 |
| 1 | 4.38 | 0.72 |

The test results shown in Table A are merely illustrative of the basic process outcome. A preferable arrangement of the process would utilize an energy of 50 KeV to perform the boron implant. The lesser value reduces the thermal stress on the photoresist and ensures a more consistent impurity distribution.

The test results shown in Table B substantiate that the zener diode breakdown voltage varies in substantial inverse proportion to the implant dose.

TABLE B

Description
Nominal zener diode breakdown voltage for a wafer subjected to a boron implant.

| Implant Dose (Ions/cm$^2$) | Implant Energy (KeV) | Nominal Breakdown Voltage At 100 μamps (Volts) |
|---|---|---|
| $5.0 \times 10^{13}$ | 75 | 8.7 |
| $1.0 \times 10^{14}$ | 75 | 8.2 |
| $5.0 \times 10^{14}$ | 75 | 7.0 |
| $1.0 \times 10^{15}$ | 75 | 5.9 |
| $1.0 \times 10^{15}$ | 50 | 5.7 |

Another embodiment of the fundamental process to which this invention pertains is illustrated in the sequence of drawings extending between FIG. 3B and Fig. 9B, the "B" sequence. The starting structure is again the standard configuration depicted schematically in FIG. 2 after the contact enhancement diffusion step. As was true for the "A" sequence, the "B" sequence of steps begins with a conventional etch of glaze oxide 9 to expose poly layer 7 and surface 11 of diffused region 12.

According to the "B" sequence, the deglazed wafer is thereafter subjected to an oxidation step to form the structure shown in FIG. 3B. The growth of oxide layers 34 and 36 are performed simultaneously using a dry O$_2$ environment at 750° C. for approximately 10 minutes. Under those conditions, relatively thin oxide layer 34, covering diffused region 12, grows to a thickness in the range of 50-200 Angstroms, while oxide layer 36 covering poly layer 7 grows to an even thinner 50-100 Angstrom range. Note that the oxidation process for the "B" sequence minimizes, rather than accentuates, the differential growth of oxide. Again, oxide layers 34 and 36 serve to prevent contamination of the silicon with trace impurities from the succeeding photoresist layer.

In progressing from the structure of FIG. 3B to that of FIG. 4B, PR layer 16 is deposited and photolithographically patterned with only coarse alignment to expose the active region. Oxide layers 34 and 36 are then subjected to a plasma or wet oxide etch, 37, using either a composition of CF$_4$ plus O$_2$ for 30 seconds or a composition of 7:1 buffered HF for 5 seconds, respectively.

Without removing masking PR layer 16, the exposed silicon of poly layer 7 and diffused region 12 are subjected to poly etch 38, as depicted in FIG. 5B. Preferably, the etch is performed with a plasma of CF$_4$ plus O$_2$ for 2.5 minutes to remove the approximately 3000 Angstroms of poly 7 remaining. As is apparent from the shape of the cross-sectional schematic in FIG. 6B, poly etch 38 (FIG. 5B) also etches away a section of the substrate, at 39, to a depth in the range of 3200–3800 Angstroms. During poly etch 38, gate oxide layer 6 serves as an etchant mask to cover the p$^-$ doped section of substrate 1, at location 41, and the 1.5 micron lateral diffusion of region 12 under gate oxide layer 6 at location 42. It is no doubt apparent that diffused region 12 must have sufficient depth, and lateral displacement at 42, to readily accommodate the volume of substrate etched at 39.

The differences in structural effect obtained with the "A" and "B" sequences are now readily apparent. Whereas the "B" sequence allows etching of diffused region 12, the "A" sequence explicitly seeks to avoid removal of any substrate. Any preference for the "A" sequence is to a large extent due to commonly prevailing concern that etching induced defects in region 12 at 43 will permit greater leakage currents in the zener diode. Though this remains a valid consideration in choosing the fabrication process, it should be recognized that a number of factors mitigate the effects of the surface damage created during the "B" sequence of fabrication. First, etched surface 43 is isolated within relatively conductive diffused region 12. Second, the zener diode junction will be located away from the etch-damaged surface by virtue of underdiffusion 42. And finally, a substantial amount of the surface damage is removed during the annealing operation which follows.

Turning again to FIG. 6B, the structure shown therein is subjected to oxide etch 21 to remove the 700 Angstroms of gate oxide 6. The silicon surfaces at 41, 42 and 43 serve as etchant barriers to the oxide etchant when oxide etch 21 is implemented according to the process described hereinbefore with reference to FIG. 6A.

Upon removing gate oxide 6, the wafer is subjected to boron ion implant 22, depicted in FIG. 7B, in the manner described with reference to FIG. 7A. Namely, a dose of $1 \times 10^{15}$ ions/cm$^2$ at an energy of 50 KeV. Note that PR mask 16 is again retained during the process operation illustrated in FIGS. 4B, 5B, 6B and 7B.

The results of boron ion implant 22 are depicted in FIG. 8B. Boron ions 23 are shown generally as lying beneath the surface in areas 41, 42 and 43. The anneal operation, 26, which follows, diffuses the boron ions without significantly altering the depth of the peak concentration from its average depth of approximately 1,800 Angstroms. Again, the anneal heals surface damage caused during the etching and boron implant operations.

Fabrication of the zener diode according to the "B" sequence is concluded with the deposition and patterned etching of conductive electrodes 28 and 31, respectively bonded to p$^+$ doped region 29 in substrate 1 and n$^+$ doped subregion 44 of diffused region 12.

Note that the p-n junction of the zener diode at 32 is displaced laterally from etched surface 43 and is buried into the substrate by approximately 1800 Angstroms at its point of peak concentration. Consequently, the onset of the zener avalanche will not be altered by surface defects in the manner generally described in the cited prior art.

In comparing the structures produced by following the "A" and "B" sequences of fabrication, respectively shown in FIGS. 9A and 9B, it is no doubt appreciated that the zener diode junction is at the same relative position on the substrate, by virtue of the underdiffusion at 42 (FIGS. 6B and 8B). The substantial identity applies to both lateral location and depth of the peak implanted ion concentration.

The two process sequences described hereinbefore relate to the fabrication of a structural arrangement referred to as the adjacent zener diode. The ensuing description will develop the process directed to forming a concentric zener diode. It will no doubt be recognized that the processing sequence for the concentric diode is identical in material steps, differing primarily in the structural pattern of the poly layer and diffused S/D regions. Whereas in the adjacent zener diode structure poly layer 7 (FIG. 1) abutted oxides 2 and 8, the structural arrangement for the concentric zener diode, at the stage of processing corresponding to FIG. 2, has the appearance of a classic FET in the cross section. As shown in FIG. 10, poly layer 46 is separated by gate oxide 50 from substrate 1. Note, however, that diffused $n^{++}$ region 45 is electrically common by way of a joining path extending in the third dimension. Also shown in FIG. 10 are grown and deposited oxides 48 which are analogous to grown and deposited oxides 8 shown in the adjacent diode configuration in FIG. 2.

Subjecting the concentric zener diode configuration in FIG. 10 to process sequences "A" or "B" produces the structural variants appearing in respective Figs. 11A and 11B. One electrode of each zener diode is formed by electrode 49 to $p^+$ doped region 51. In the configuration of Fig. 11A, the remaining electrode is common electrode 52 of common $n^+$ doped subregion 53. Correspondingly, for the structure in Fig. 11B the other electrode of the zener diode is electrode 54 bonded to common $n^+$ doped subregion 56. Note that the buried zener diode junction at 57 in both configurations remains substantially the same in terms of location and general character.

FIG. 12 presents the top view masks for fabricating the structure shown in Fig. 11A. In terms of location, the upper view is a section through the pattern in the lower view at line A—A. Note that active area mask 58 coincides with the area circumscribed by field oxides 47. In like manner, electrode mask 59 corresponds to electrode 49, electrode mask 61 corresponds to electrode 52, and poly mask 62 corresponds to poly 46 (FIG. 10). As is no doubt appreciated, the mask patterns illustrated in FIG. 12 are not to scale, and therefore, make no attempt to compensate for commonly understood problems such as etching undercuts and mask misregistrations.

Note that the concentric zener diode configuration in FIG. 12 is a structural end product which has a significantly greater junction area than that normally attributable to the adjacent zener diode structural arrangement. That is, the junction includes three full edges of poly mask 62 in FIG. 12.

A variant of the concentric zener diode configuration shown in Fig. 11A is depicted by cross section in FIG. 13. In this case, the active area mask, such as 58 in FIG. 12, is enlarged to significantly increase the area doped during the S/D diffusion into regions such as 63 and 64. At a point in the process preceding the contact enhancement diffusion, corresponding to a step performed between FIGS. 1 and 2 of the drawings, grown and deposited oxides are utilized in conventional manner to form dielectric walls 66 and 67. After the contact enhancement diffusion, the substrate oxide and the PR mask are used to cover the contact openings at 68 and 69 from the zener fabrication processes. Access to the contact openings at 68 and 69 is made immediately before the annealing step, by the removing of the photoresist and performing a short deglazing oxide etch operation. Electrodes 71 and 72 are formed thereafter in the same process operation which forms electrode 49.

In considering the present invention, as illustrated by way of its various embodiments, one may gain some perspective and appreciation for the features inherent in the unified process disclosed. For one, recall that the zener diode fabrication process is readily interposed in the course of conventional IC wafer processing. Further, note that the steps added to implement the process require but one new mask, which mask imposes only a coarse alignment requirement by virtue of the preexisting field oxides. It will also be appreciated that the zener diode structure is inherently self-aligned, whether implemented in the adjacent diode or the concentric diode configurations, by the diffusion masking of the poly layer. The alignment and characteristic underdiffusion of the S/D regions ensures that the junction created during the ion implant step lies not only under the surface, but is laterally displaced from areas potentially subjected to significant etching. Thereby, it is possible to fabricate zener diodes with consistent characteristics. And finally, the sequence of processing described for the present invention requires no significant departure from general practices used in the fabrication of FETs and the formation of contacts thereto.

Another aspect of the novel process can be appreciated by considering the copending application noted hereinbefore. With reference to that application, note that the mask used to define the epitaxial contact coincides in the process sequence with the active region mask of the presently-taught process. Therefore, zener diode fabrication is fully compatible with an epitaxial contact formation process.

It should be recognized and appreciated that the features introduced by the particular illustrative embodiments described hereinbefore are sufficiently broad to allow their ready inclusion into diverse fabrication processes. Therefore, the combination of steps described hereinbefore and claimed as follows should be accorded a scope commensurate with the full spirit of the invention disclosed.

We claim:

1. A process for forming zener diodes from FET-like structures in an active region of a semiconductor wafer doped lightly with a first conductivity type impurity, which active region includes a first area covered by substantially coincident oxide and conductive electrode layers, said oxide layer disposed between said conductive layer and said semiconductor wafer, and a second area defining a conductive region in the wafer doped heavily with a second conductivity type impurity, said first and second areas having a common boundary, comprising the steps of:

forming an oxide layer on at least the surface of said wafer in said second area;

defining a third area encompassing both said first and second areas of said wafer;

exposing said conductive electrode layer;

removing said exposed electrode layer; and doping said third area with a first conductivity type impurity to the extent that said wafer in said first area becomes a first conductivity type region of moderate doping and said wafer in said second area becomes a second conductivity type region of less heavy doping.

2. The process recited in claim 1, including the further steps of:
   removing oxide from said wafer to expose said wafer in said third area;
   annealing said wafer after said doping step;
   bonding interconnecting electrodes to said first conductivity type region of moderate doping and to said second conductivity type region of less heavy doping.

3. The process recited in claim 2, wherein said oxide is silicon dioxide, said wafer is monocrystalline silicon, said conductive electrode layer is polycrystalline silicon, and said step of forming an oxide is comprised of a thermal oxidation of said wafer to form silicon dioxide over said first and second areas.

4. The process recited in claim 3, wherein said steps of exposing said conductive electrode layer comprises an etching operation performed with an oxide etchant that does not materially etch silicon, and said step of removing said exposed electrode layer comprises an etching operation performed with a silicon etchant that does not materially etch oxide.

5. The process recited in claim 4, wherein said step of forming an oxide by thermal oxidation is performed with wet $O_2$, to accentuate the differential growth between the silicon dioxide layer formed from the monocrystalline silicon and the layer formed from the polycrystalline silicon, and is continued until the differential thickness ensures that oxide remains over said second area of the wafer at the conclusion of said step of exposing said conductive electrode layer.

6. The process recited in claim 4, wherein said first area and said second area materially overlap.

7. The process recited in claim 6, wherein the thickness of said polysilicon conductive electrode, the depth of said second conductivity type region in said wafer, the composition of said silicon etchant that does not materially etch oxide, and the duration of said step of removing said exposed electrode layer are related so that said step of removing said exposed electrode layer can continue until said polycrystalline silicon conductive electrode layer is completely removed without etching into said second conductivity type region in said wafer to a material depth.

8. The process recited in claim 5, wherein said step of defining a third area is performed with a photolithographically processed photoresist mask and said step of doping said third area is performed by ion implantation with ions having an energy sufficient to locate the peak first conductivity type impurity concentration approximately 1800 Angstroms below any exposed surface of said wafer.

9. The process recited in claim 7, wherein said step of defining a third area is performed with a photolithographically processed photoresist mask and said step of doping said third area is performed by ion implantation with ions having an energy sufficient to locate the peak first conductivity type impurity concentration approximately 1800 Angstroms below any exposed surface of said wafer.

* * * * *